US007194096B2

(12) United States Patent
Graumann

(10) Patent No.: US 7,194,096 B2
(45) Date of Patent: Mar. 20, 2007

(54) METHOD AND APPARATUS FOR ADAPTIVELY PRE-SHAPING AUDIO SIGNAL TO ACCOMMODATE LOUDSPEAKER CHARACTERISTICS

(75) Inventor: David L. Graumann, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 756 days.

(21) Appl. No.: 10/603,349

(22) Filed: Jun. 25, 2003

(65) Prior Publication Data

US 2004/0264711 A1 Dec. 30, 2004

(51) Int. Cl.
*H03G 5/00* (2006.01)

(52) U.S. Cl. ...................................... 381/103; 381/104

(58) Field of Classification Search ................. 381/98, 381/103, 56, 57, 55, 104, 107
See application file for complete search history.

(56) References Cited

U.S. PATENT DOCUMENTS 4,628,530 A * 12/1986 Op De Beek et al. ...... 381/103
6,341,166 B1 * 1/2002 Basel ......................... 381/103
2002/0012437 A1 * 1/2002 Murata et al. ................ 381/98
2002/0159607 A1 * 10/2002 Ford et al. .................. 381/103

OTHER PUBLICATIONS

Knapp, C.H. and Carter, G.C., "The Generalized Correlation Method for Estimation of Time Delay", IEEE Trans. Acoust. Speech Signal Process, vol. ASSP-24, pp. 320-327, Aug. 1976.

W. Frank, "An efficient approximation to the quadratic Volterra filter and its application in real-time loudspeaker linearization", Signal Processing, vol. 45, No. 1, pp. 97-113, 1995.

Franklin X.Y. Gao and W. Martin Snelgrove, "Adaptive Linearization of A Loudspeaker", Proc. Int. Conf. Acoust., Speech, Signal Processing, Toronto, pp. 3589-3592, May 1991.

* cited by examiner

*Primary Examiner*—Brian T. Pendleton
(74) *Attorney, Agent, or Firm*—Buckley, Maschoff & Talwalkar LLC

(57) ABSTRACT

An input audio signal is analyzed to determine a power spectral density profile and the power spectral density profile is compared with at least one template profile. On the basis of the comparison, frequency bands of the input audio signal are selectively attenuated.

40 Claims, 8 Drawing Sheets

METHOD AND APPARATUS FOR ADAPTIVELY PRE-SHAPING AUDIO SIGNAL TO ACCOMMODATE LOUDSPEAKER CHARACTERISTICS

BACKGROUND

Many portable electronic devices include a loudspeaker to audibly produce or reproduce audio information. Because of the overall size of the electronic device or because of other design constraints, the loudspeaker is often quite small. As a result, the quality of sound produced by the loudspeaker may be poor, particularly when the loudspeaker is driven at a relatively high volume. Uniformly band-limiting the signal employed to drive the loudspeaker may reduce the distortion in the speaker output, but may also result in poor sound quality.

DETAILED DESCRIPTION

Figure 1:
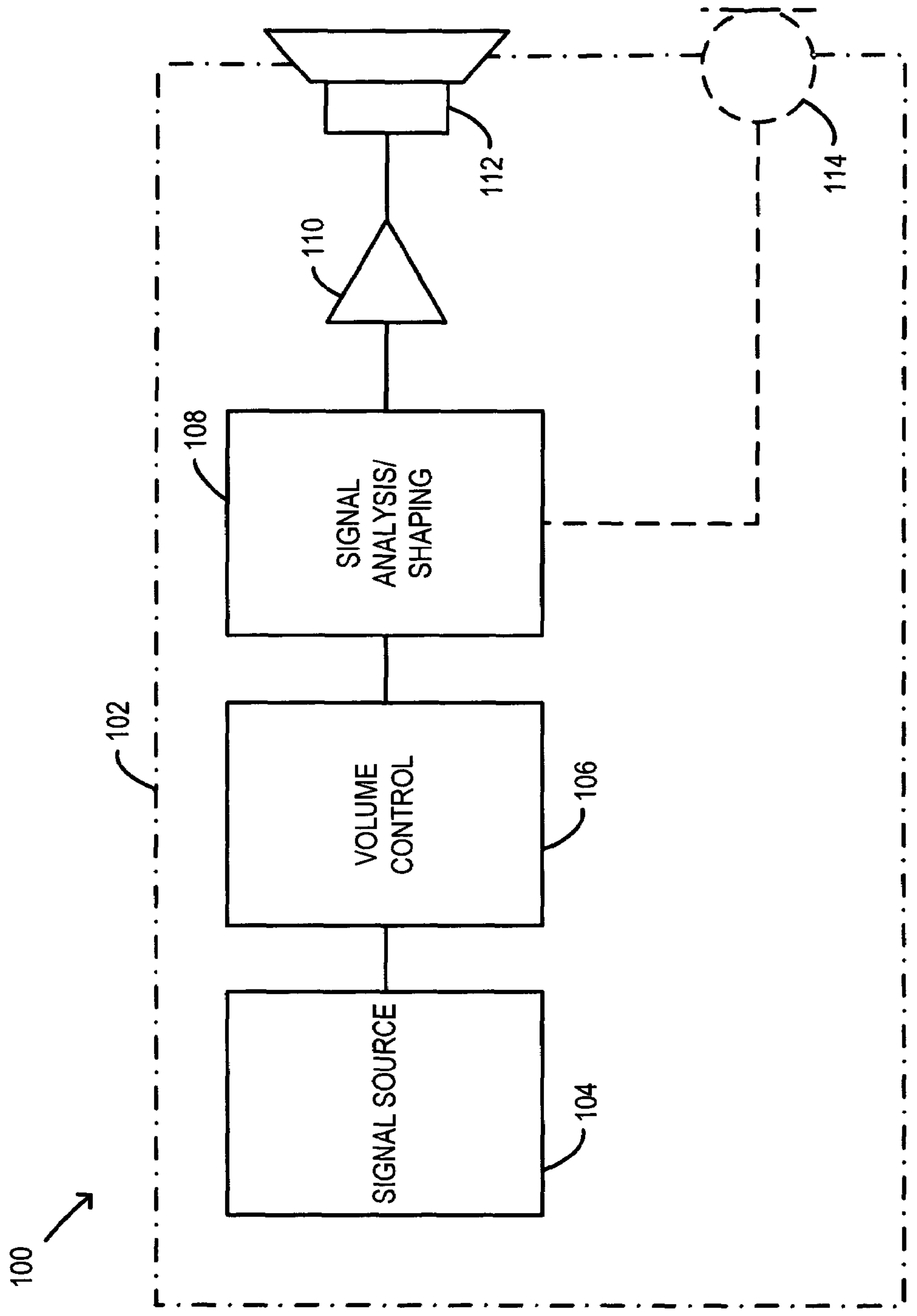
FIG. 1 is a block diagram of an electronic device provided according to some embodiments.

FIG. 1 is a simplified block diagram of an electronic device 100 according to some embodiments. The electronic device 100 may be, for example, a portable electronic device such as a cellular telephone, a cordless telephone, a PDA (personal digital assistant) with voice recording and playback capabilities, a sound recording/reproducing or reproducing device, or a notebook computer with sound production or reproduction capabilities. The electronic device 100 includes a housing 102 (indicated by dot-dash lines) that may, for example, be shaped and sized so that the device is readily portable. For instance, the housing 102 may be shaped and sized to fit within the palm of a user's hand.

Housed within and/or on the housing 102 is a signal source 104 which provides an audio signal that is to be acoustically reproduced. The signal source 104 may be provided in accordance with conventional practices and may be, for example, the signal receiving portion of a cellular telephone or cordless telephone, or the audio signal storage and retrieval portion of a sound recorder or a PDA. A volume control 106 may be coupled to the signal source 104 and may be housed in and/or on the housing 102. The volume control 106 may be provided in accordance with various practices and may be arranged to receive user input (e.g., via a push button, wheel switch, touch screen, etc., none of which are separately shown) to allow the user to adjust the volume of sound produced by the electronic device 100. The volume control 106 may include, for example, a variable amplifier (not separately shown) that is responsive to user input to provide a variable gain to an audio signal output from the signal source 104.

The electronic device 100 also includes a signal analysis and shaping block 108 provided according to some embodiments. The signal analysis and shaping block 108 is housed in the housing 102 and is coupled to receive the audio signal from the signal source 104 after the variable gain from the volume control 106 has been applied to the audio signal. After the audio signal has been analyzed by, and possibly also shaped by, the signal analysis and shaping block 108, in a manner that is described below, the audio signal may be coupled by one or more gain stages (indicated at 110) to drive a conventional loudspeaker (also referred to as a "speaker") 112 that is mounted in, on, or external to the housing 102. (Although not shown in the drawing, a digital-to-analog converter may be coupled between the signal analysis and shaping block 108 and the gain stage 110.)

In some embodiments, the electronic device 100 may also include a microphone 114 that is indicated in phantom and may be mounted in, on, or external to the housing 102. In some embodiments, a signal received via the microphone 114 may be supplied to the signal analysis and shaping block 108 for purposes that are described below. (Although not indicated in the drawing, analog-to-digital conversion or other processing may be applied to the microphone signal.)

Figure 2:
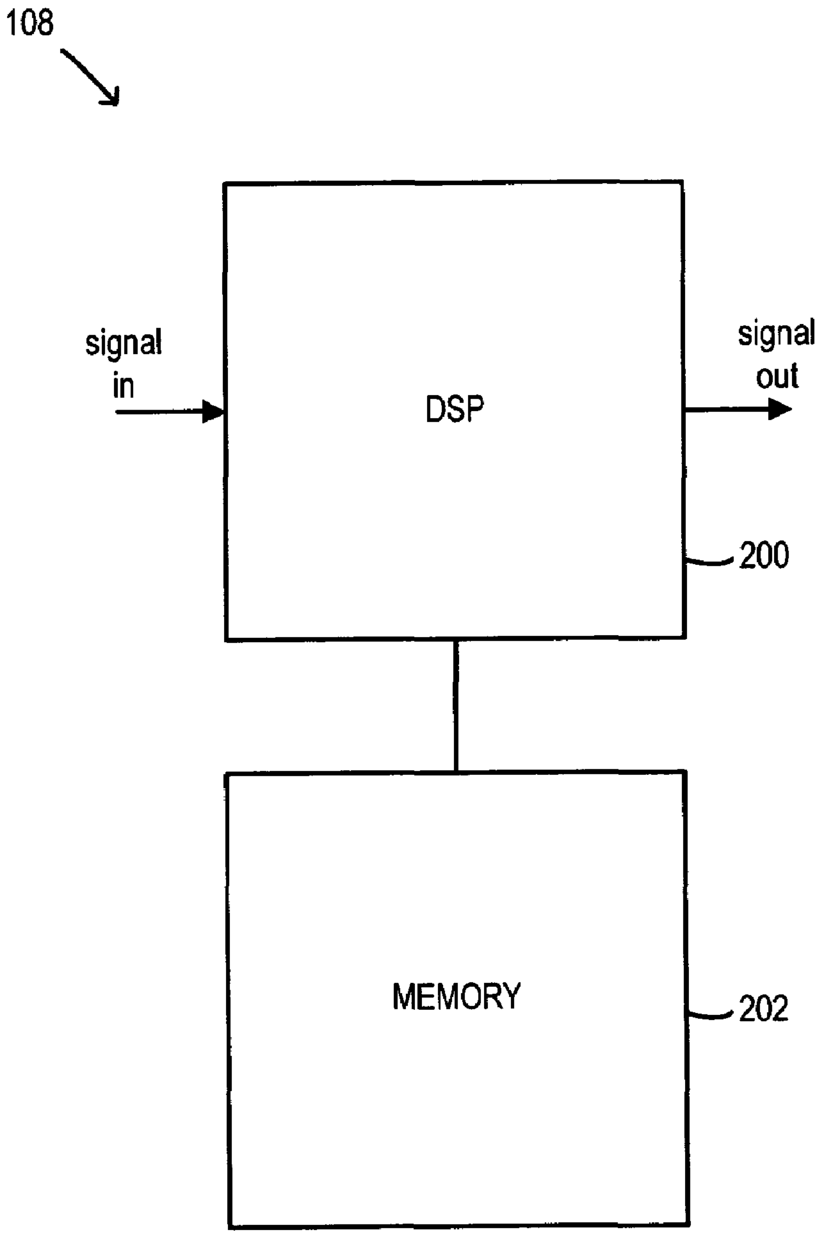
FIG. 2 is a block diagram of an audio signal analysis and shaping block of the electronic device of FIG. 1.

FIG. 2 is a block diagram that illustrates hardware aspects of the signal analysis and shaping block 108 as provided according to some embodiments. As illustrated in FIG. 2, the signal analysis and shaping block 108 may include a digital signal processor (DSP) 200 and a memory 202 that is coupled to the DSP 200. The DSP 200 may be programmed to perform the signal analysis and shaping functions that are described below. The memory 202 may store a program which controls the DSP 200 and may store other information (described below) which guides signal analysis and/or signal shaping functions performed by the DSP. In other embodiments, the functions of the signal analysis and shaping block 108 may be performed by a processor which generally controls functions of the electronic device 100, and which may be, for example, a general purpose microprocessor or microcontroller. In these embodiments, the processor may be programmed to perform the functions of the signal analysis and shaping block 108. In still other embodiments, the functions of the signal analysis and shaping block 108 may be performed by specially designed processing circuitry which may, but need not, be integrated with circuitry that performs other functions. Two or more processors which together or individually perform the functions of the signal analysis and shaping block 108 may be encompassed by the term "processor," as used herein.

Figure 3:
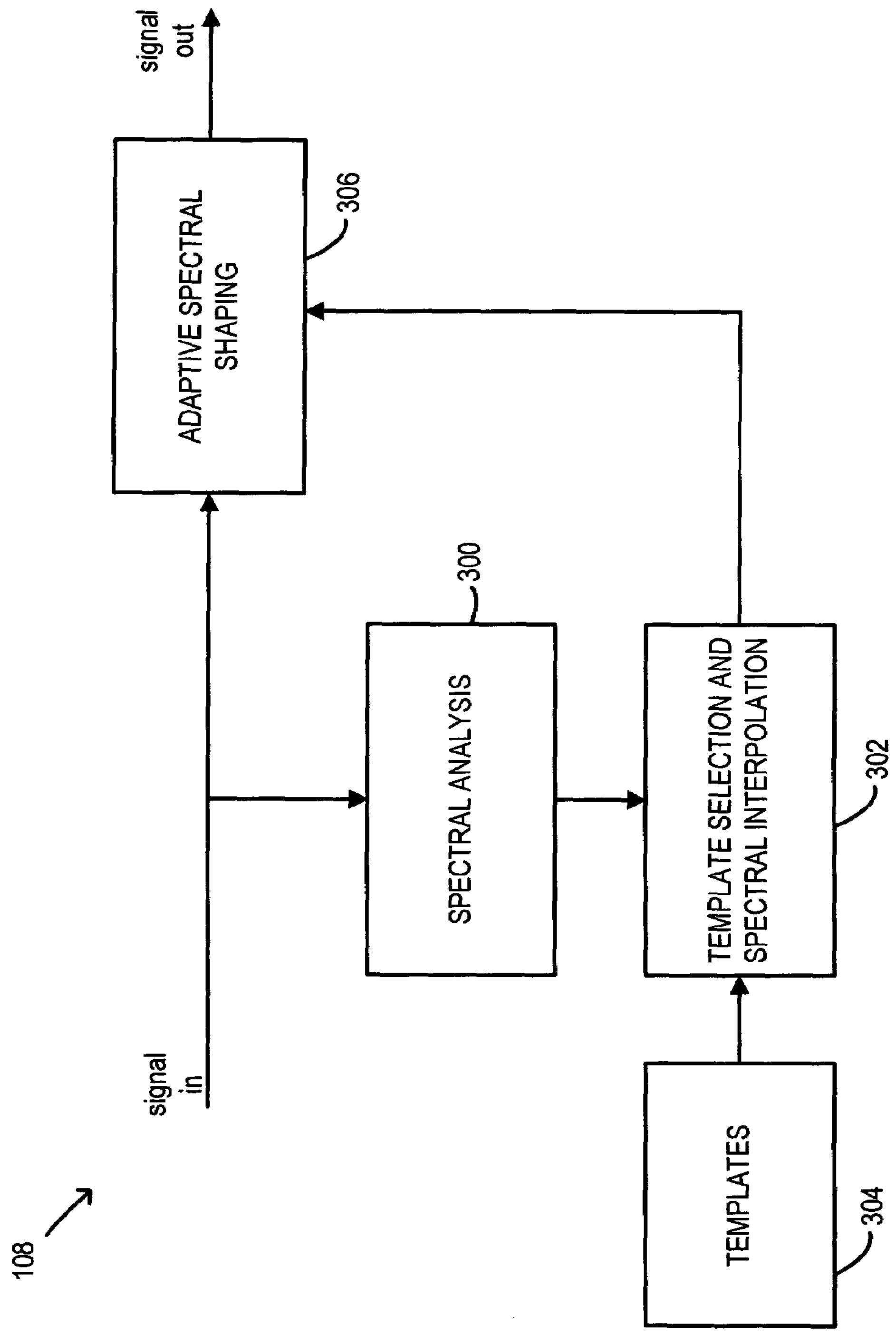
FIG. 3 is a functional block diagram of the audio signal analysis and shaping block of the electronic device of FIG. 1.
Figure 4:
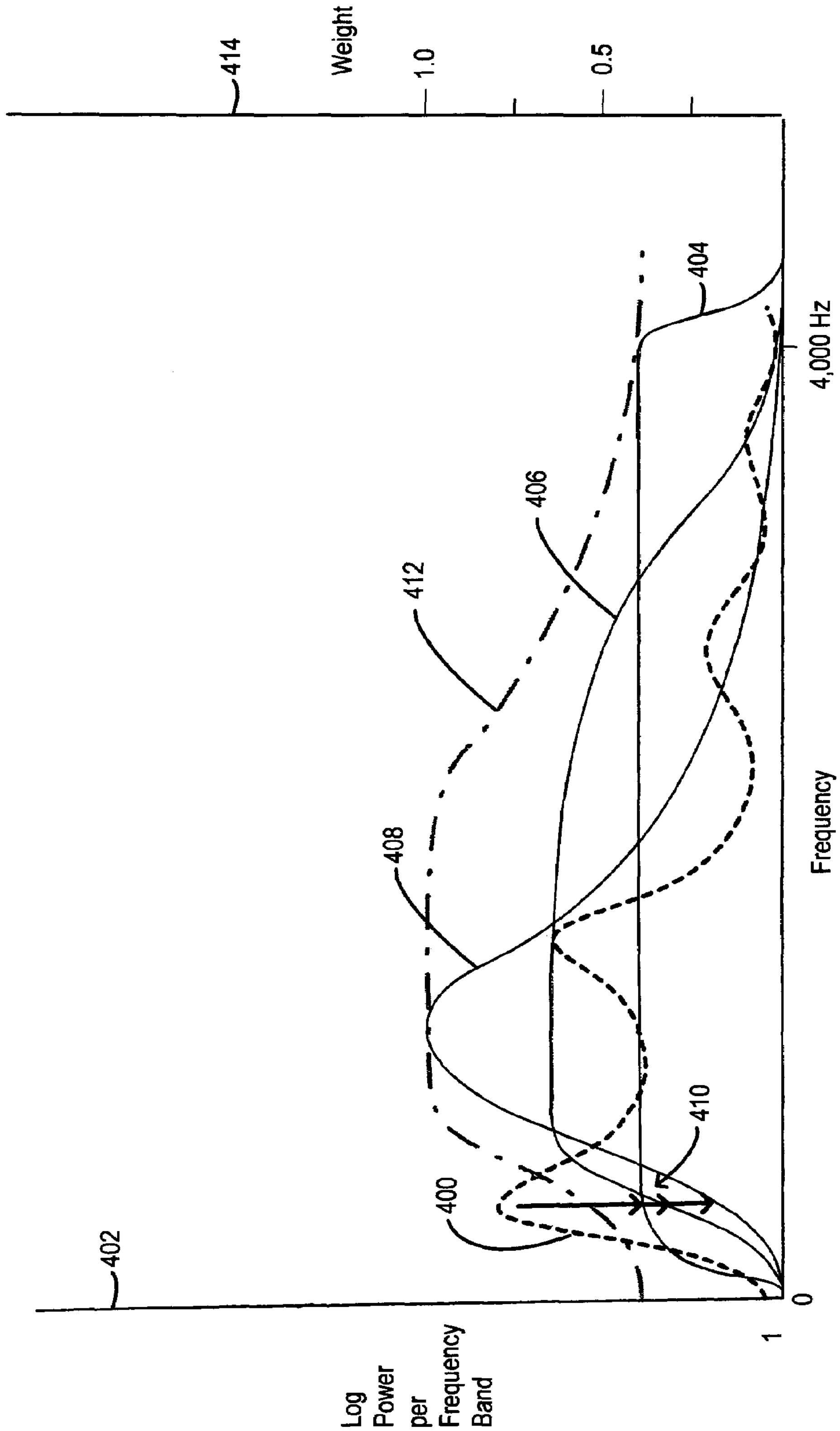
FIG. 4 is a graph that shows template profiles, a weighting function and an example simulated input signal power spectral density profile used in or generated by the audio signal analysis and shaping block of FIGS. 2 and 3.

FIG. 3 is a functional block diagram illustration of functions that may be performed by the signal analysis and shaping block 108. As seen from FIG. 3, the signal analysis and shaping block 108 may include a spectral analysis block 300 that receives the input audio signal provided to the signal analysis and shaping block 108 and analyzes the input audio signal to determine spectral characteristics of the input audio signal. In particular, the spectral analysis block 300 may perform, e.g., a discrete Fourier transform (DFT) on the input audio signal. In some embodiments the spectral analysis block 300 may perform a DFT with a window that overlaps with a prior window by 50% and has a window length of 40 milliseconds. The result of the DFT may be a power spectral density profile which is indicative of respective quantities of power in frequency bands of the input audio signal. A simulated graphical representation of an example of such a power spectral density profile is indicated by curve 400 in FIG. 4. (The left-hand vertical axis 402 in FIG. 4 is applicable to power spectral density profile curve 400.)

It will be appreciated that the spectral analysis block 300 may produce a sequence of power spectral density profiles as an ongoing audio input signal is supplied to the spectral analysis block 300 over the course of time in the form of a sequence of samples. Other spectral analysis techniques than a DFT may be employed in the spectral analysis block 300. For example, wavelet analysis may alternatively be employed by the spectral analysis block 300. In addition, time windows of different lengths and/or with a different degree of overlap (or with no overlap) may be employed instead of the window parameters indicated in the previous paragraph.

The sequence of power spectral density profiles produced by the spectral analysis block 300 may be provided as an input to a template selection and spectral interpolation block 302 (FIG. 3). A set of template profiles 304 may be associated with the template selection and spectral interpolation block 302. The template profiles 304 may include, for example, three template profiles (not separately shown in FIG. 3) which may be stored in a suitable memory such as the memory 202 (FIG. 2).

A function of the template selection and spectral interpolation block 302 may be to determine how well the input audio signal, as represented by the power spectral density profile provided by the spectral analysis block 300, matches one or more of the template profiles 304, and, if necessary, to generate respective attenuation factors to be applied to frequency bands of the input audio signal to shape the input audio signal to fit a selected one of the template profiles 304. The attenuation factors generated by the template selection and spectral interpolation block 302 may be supplied to an adaptive spectral shaping block 306 (FIG. 3) which applies the attenuation factors to shape the input audio signal.

Curves 404, 406, 408 shown in FIG. 4 graphically illustrate an example set of three template profiles that may be employed in association with the template selection and spectral interpolation block 302 (FIG. 3). The left-hand vertical axis 402 is applicable to the curves 404, 406, 408. The template profiles may be developed by experimentation undertaken during the design of the electronic device 100, by exercising a loudspeaker of the type to be employed in the electronic device 100. For example, tones and/or "pink noise", alone or in combination and at one or more volumes, may be used to drive a sample loudspeaker to determine what frequencies drive the loudspeaker into non-linear sound reproduction. In one embodiment, the templates may be designed to substantially exclude the frequencies which drive the loudspeaker to non-linear sound reproduction while preserving frequency bands in the range of 1500 Hz to 3000 Hz (for example), as much as possible consistent with preventing non-linear driving of the loudspeaker. By tending to preserve frequency bands in the range of about 1500 Hz to 3000 Hz, the over-all intelligibility and perceived sound quality of a voice signal reproduced by the loudspeaker may be enhanced while avoiding distortions that may result from non-linear performance of the loudspeaker.

Testing of a loudspeaker and formulation of a set of one or more templates are well within the capabilities of those who are skilled in the art, in view of the guidance provided herein, and may be accomplished without undue experimentation.

The templates may take into account the amount of gain to be applied to the input audio signal after shaping by the signal analysis and shaping block 108.

Operation of the template selection and spectral interpolation block 302 will now be described with reference to FIG. 5, which is a flow chart that illustrates functions performed by the template selection and spectral interpolation block 302, according to some embodiments of the invention.

Figure 5:
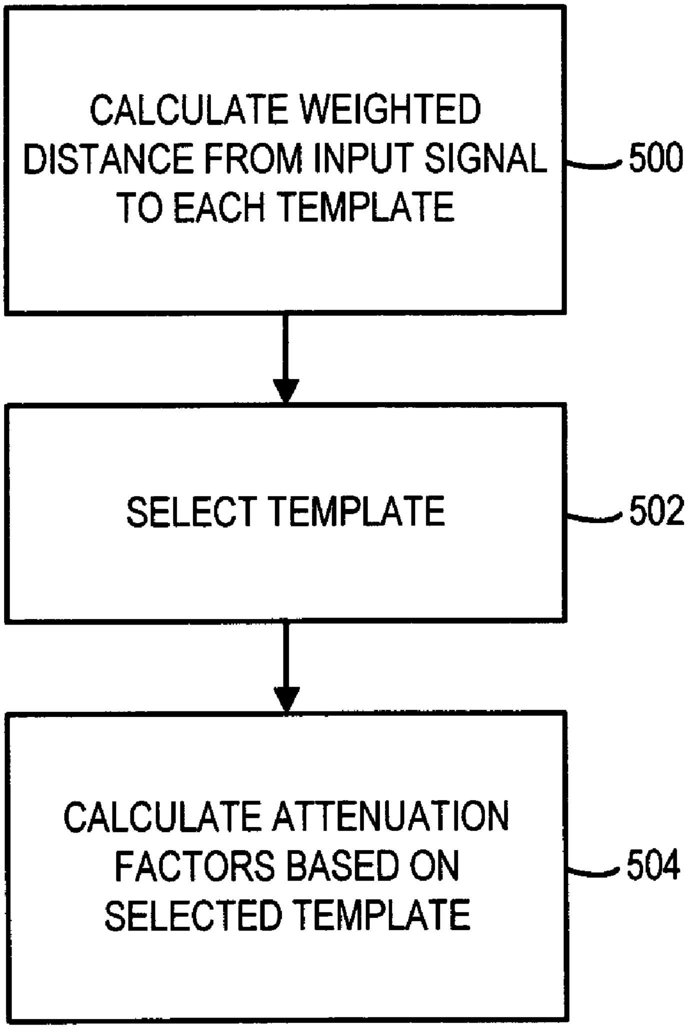
FIG. 5 is a flow chart that illustrates operation of a template selection and spectral interpolation block shown in FIG. 3.

At 500 in FIG. 5, the template selection and spectral interpolation block 302 compares the current power spectral density profile of the input audio signal with each of the template profiles. This may be done, for example, by calculating with respect to each template profile a weighted distance between the power spectral density profile and the template profile in question. Although the power spectral density profile and the template profiles may be graphically represented, as indicated by curves 400, 404, 406, 408, it will be understood that in some embodiments the power spectral density profile and the template profiles may be stored and manipulated in the form of transform coordinates or other numerical representations of power levels corresponding to each frequency band of the respective profiles.

Determining the distance between the power spectral density profile and the template profiles at a particular frequency band is pictorially indicated at 410 in FIG. 4. For each frequency band, the distance measurement $D_i(\omega)$ for the ith template profile may be set to 1 if the power level for the power spectral density profile of the input audio signal in the frequency band is equal to or less than the power level for the ith template profile for the frequency band. Otherwise, $$D_i(\omega)=|X(\omega)|/|T_i(\omega)|,$$

where $|X(\omega)|$ represents the power level of the input audio signal for the frequency band, and $|T_i(\omega)|$ represents the power level for the ith template profile for the frequency band.

For each template profile, an aggregate weighted distance measurement $A_i$ corresponding to the distance between the power spectral density profile for the input signal and the template profile in question, may be calculated as the summation over all the frequency bands of: $D_i(\omega)/W(\omega)$, where $W(\omega)$ is a weighting factor for the frequency band and is based on a weighting function such as that illustrated by curve 412 in FIG. 4. The right-hand vertical axis 414 in FIG. 4 is applicable to the weighting function curve 412. In some embodiments, the weighting function may take on values between 0.5 and 1.0 and may be such as to favor (minimize weighted distance in regard to) signals in the frequency bands in the range of about 1000 Hz to 2000 Hz, with a sharper roll-off for frequency bands below that range.

On the basis of the aggregated weighted distance measurements $A_i$ for the template profiles, one of the templates may be selected, as indicated at 502 in FIG. 5. For example, the template for which the lowest aggregated weighted distance measurement was obtained may be selected.

It should be noted that the process of selecting a template profile may be truncated in the event that it is found that the current power spectral density profile of the input audio signal is entirely contained at or below one or more of the template profiles. In this case, and subject to the smoothing process described below, the outcome of the processing provided by the template selection and spectral interpolation block 302 may be that there should be no shaping of the input audio signal. Examination of the current power spectral density profile may be truncated upon finding that the current power spectral density profile fits at or below any one of the template profiles. The current power spectral density profile may first be compared to the template profiles to determine whether the current power spectral density profile fits at or below any of the template profiles before the comparison for calculation of the aggregated weighted distance measurements $A_i$ is performed.

In any event, assuming that the aggregated weighted distance measurements $A_1$ are calculated for the current power spectral density profile relative to the template profiles, and the template profile corresponding to the lowest of the aggregated weighted distance measurements $A_i$ is selected, the template selection and spectral interpolation block 302 may then calculate a set of attenuation factors to be applied to the input audio signal based on the selected template profile. For example, a smoothing function such as the following may be employed:

$$\alpha_t(\omega)=\beta\alpha_{t-1}(\omega)+(1-\beta)D_s(\omega),$$

where:

$\alpha_t(\omega)$ is the current applicable attenuation factor for the frequency band in question;

$\alpha_{t-1}(\omega)$ is the attenuation factor that was applicable for the frequency band in question for the prior cycle;

$D_s(\omega)$ is the distance for the frequency band in question between the power spectral density profile and the selected template profile (noting again that $D_s(\omega)=1$ if the power spectral density profile is at or below the selected template profile for the frequency band in question); and $\beta$ is a smoothing factor.

The smoothing factor $\beta$ may be selected or calculated in a number of ways. In some embodiments, the smoothing factor $\beta$ may be calculated in accordance with the following:

$\beta=e^{(-d/k)}$, where d is the window duration and k is a smoothing time constant. In some embodiments, d may be 40 milliseconds, and k may be on the order of 1 to 2 seconds, but other values may also be used.

The smoothing of the attenuation factors may be employed to prevent creation of artifacts and/or discontinuities resulting from changes in the attenuation factors from cycle to cycle.

The set of attenuation factors calculated by the template selection and spectral interpolation block 302 for the current cycle may be passed to the adaptive spectral shaping block 306 for application to the respective frequency bands of the corresponding portion of the input audio signal. Although the attenuation factors provided by the template selection and spectral interpolation block 302 may be expressed in the frequency domain, as indicated by the above equations, in some embodiments the adaptive spectral shaping block 306 may apply the attenuation factors by adaptively filtering the input audio signal in the time domain. The resulting shaped audio signal is then applied to drive the loudspeaker 112 (FIG. 1).

The overall effect of the operation of blocks 300, 302, 306 (FIG. 3) is to tend to fit the input audio signal into one or the other (e.g., the closest) of the template profiles (i.e., to the template profile that is selected from time to time). Consequently, the signal analysis and shaping block 108 shapes the input audio signal so as to substantially prevent the input audio signal from driving the loudspeaker 112 to operate in a non-linear fashion. The resulting sound quality may be improved for a given (small) size of the loudspeaker 112, while as much as possible preserving the frequency bands which are most important to perceived intelligibility and quality of a reproduced voice signal.

In embodiments which incorporate the microphone 114, and in which the microphone 114 is active at the same time as the speaker 112, information from the microphone 114 may also be employed by the signal analysis and shaping block 108 in connection with shaping the audio signal to drive the speaker 112. An example of a resulting modified signal analysis and shaping block 108*a* is illustrated in block diagram form in FIG. 6.

Figure 6:
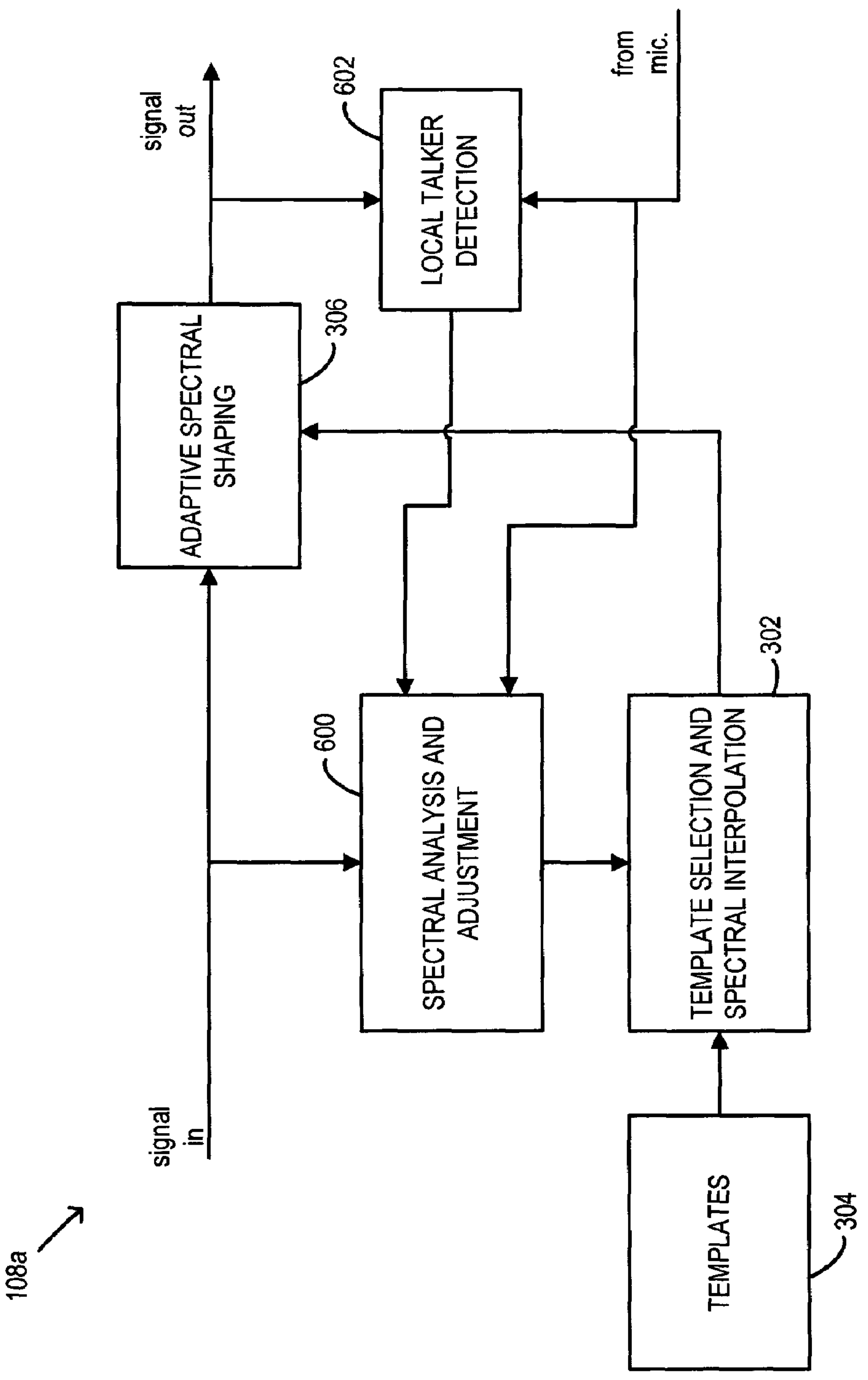
FIG. 6 is a functional block diagram of the audio signal analysis and shaping block of FIG. 2 according to some other embodiments.

In the modified signal analysis and shaping block 108*a*, the functional blocks 302, 304 and 306 (template selection and spectral interpolation, templates and adaptive spectral shaping) may be unchanged from those described above in connection with FIG. 3, and therefore need not again be described. The spectral analysis block 300 of FIG. 3 may be replaced by the spectral analysis and adjustment block 600 shown in FIG. 6, and a local talker detection block 602 may be added to form the modified signal analysis and shaping block 108*a*. It will be noted from FIG. 6 that the local talker detection block 602 has as inputs the shaped audio signal output from the adaptive spectral shaping block 306 and an audio signal obtained via the microphone 114 (FIG. 1, not shown in FIG. 6). The local talker detection block 602 provides an output (indication of local talking) that is one of the inputs to the spectral analysis and adjustment block 600. The audio signal obtained via the microphone is another input to the spectral analysis and adjustment block 600.

Operation of the spectral analysis and adjustment block 600, according to some embodiments of the invention, will now be described with reference to FIG. 7. Initially, as indicated at 700 in FIG. 7, the spectral analysis and adjustment block 600 may generate a power spectral density profile for the input audio signal, by, e.g., taking the magnitude of a discrete Fourier transform (DFT). This may be done in the same manner as in the spectral analysis block 300 of FIG. 3. Then it is determined, at 702, whether "local talking" is occurring at the microphone 114 (FIG. 1). This determination may be based on an output from the local talker detection block 602. The local talker detection block 602 may provide an output to indicate that no local talking is occurring when the audio signal output from the adaptive spectral shaping block 306 is highly correlated with the audio signal obtained via the microphone. For example, an indication that no local talking is occurring may be output from the local talker detection block 602 when the quantity $\int_{-\infty}^{\infty}(|-X'(\omega)M^*(\omega)|/|X'(\omega)X'^*(\omega)|)\,d\omega$, exceeds a threshold. ($X'(\omega)$ corresponds to the shaped audio signal which drives the speaker; $M(\omega)$ corresponds to the audio signal which is obtained via the microphone; "*" indicates a complex conjugate; and in some embodiments the threshold may be 0.7.)

Figure 7:
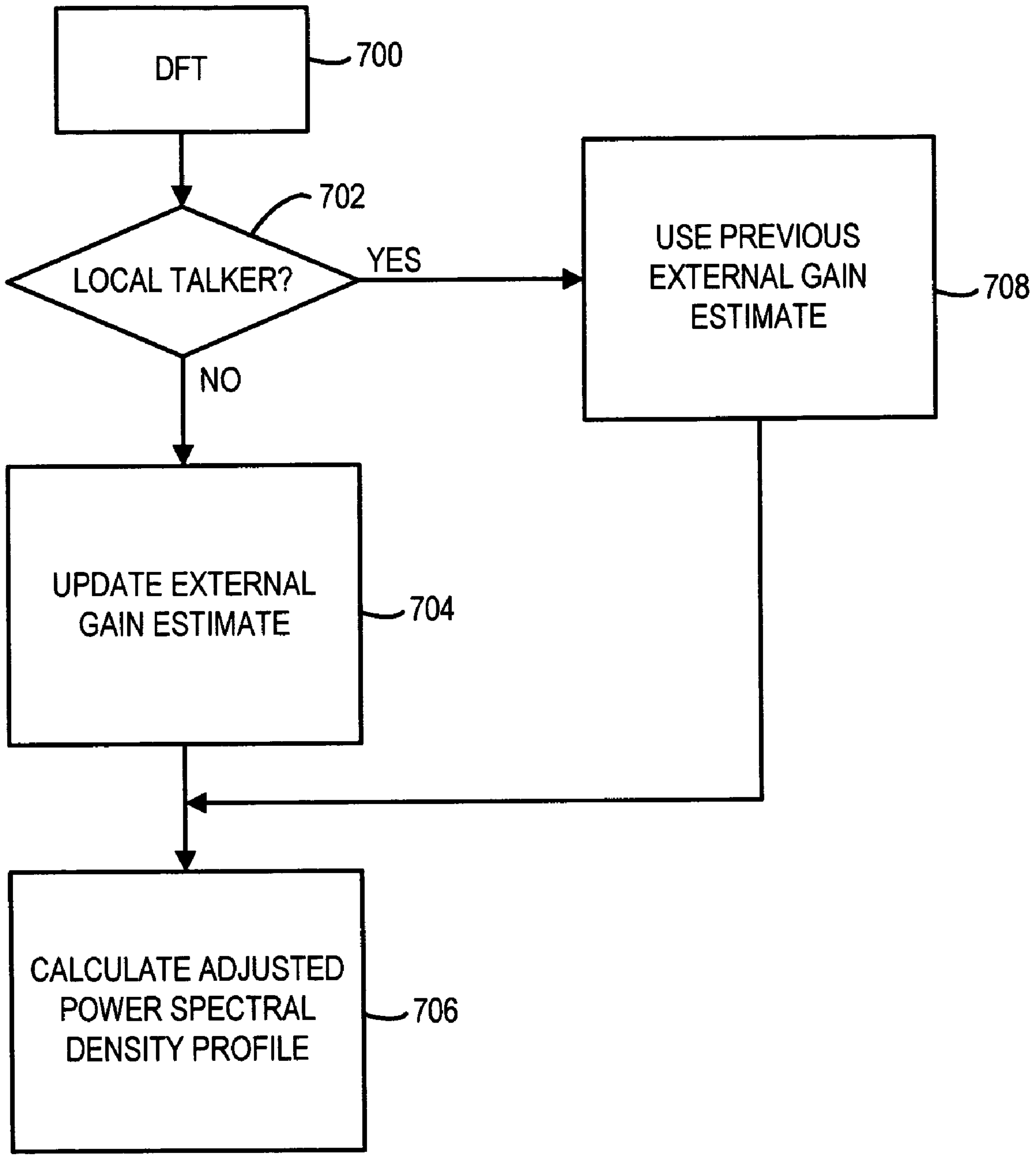
FIG. 7 is a flow chart that illustrates operation of a spectral analysis and adjustment block that is shown in FIG. 6.

Continuing to refer to FIG. 7, if at 702 it is found that no local talking is occurring, then (as indicated at 704) the spectral analysis and adjustment block 600 may update an external gain estimate $G(\omega)$, which corresponds to an estimated external gain between the speaker 112 and the microphone. The external gain estimate $G(\omega)$ may be expressed as follows:

$$G(\omega)=E[|M(\omega)|/|X(\omega)|],$$

where E[ ] denotes expected value, and $X(\omega)$ corresponds to the input audio signal before shaping.

Figure 8:
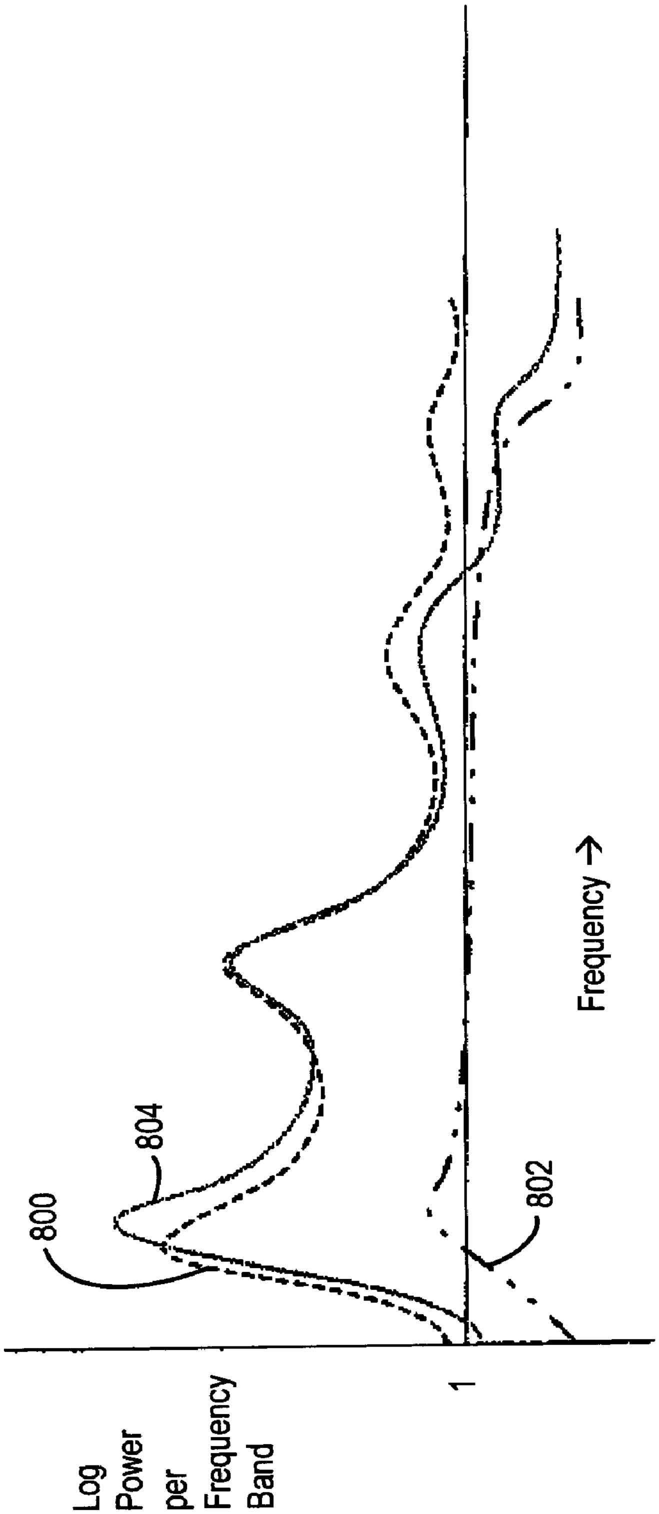
FIG. 8 is a graph that shows example simulated input signal power spectral density profile and related signals generated by the spectral analysis and adjustment block shown in FIG. 6.

After updating of the external gain estimate $G(\omega)$, the spectral analysis and adjustment block 600 adjusts the power spectral density profile (as indicated at 706) to form an adjusted power spectral density profile as the product of X(ω) and the updated external gain estimate G(ω). In FIG. 8, curve 800 represents the power spectral density profile prior to adjustment, curve 802 represents the external gain estimate, and curve 804 represents the adjusted power spectral density profile. (In FIG. 8 the curves shown are simulated examples.)

If at 702 it is determined that local talking is occurring, then, as indicated at 708, an un-updated external gain estimate is used to form the adjusted power spectral density profile (706 in FIG. 7).

The adjusted power spectral density profile output from the spectral analysis and adjustment block 600 may be employed by the template selection and spectral interpolation block 302 in the same fashion as the power spectral density profile output from the spectral analysis block 300 (FIG. 3) to select a template and to calculate attenuation factors, as described above in connection with FIG. 3.

By using the signal obtained via the microphone, the embodiment of FIG. 6 may provide improved shaping of the audio signal used to drive the speaker, so that again the speaker may be kept from operating in a non-linear region. Thus sound quality may be improved, with superior intelligibility of reproduced sound and better perceived sound quality.

On the basis of the disclosure herein, those of ordinary skill in the art would be able to readily provide software instructions to implement the embodiments described herein, as well as other embodiments. Such software instructions may, for example, be stored in a storage medium such as the memory 202 (shown in FIG. 2) to control the DSP 200.

Although the set of template profiles employed in the embodiments described herein has three template profiles, the number of template profiles employed may be one, two, or four or more.

In selecting a template, unweighted rather than weighted distances between the templates and the power spectral density profile may be used.

As has been seen, in some embodiments, an input audio signal is analyzed to determine a power spectral density profile and the power spectral density profile is compared with at least one template profile. On the basis of the comparison, frequency bands of the input audio signal are selectively attenuated.

In some other embodiments, an input audio signal is analyzed to determine a power spectral density profile and the power spectral density profile is adjusted to form an adjusted power spectral density profile. The adjusted power spectral density profile is compared with at least one template profile, and on the basis of the comparison, frequency bands of the input audio signal are selectively attenuated.

As used herein and in the appended claims, "attenuating" may include either or both of (a) applying an attenuation factor to a signal, and (b) determining an attenuation factor.

An "attenuation factor" may, but need not, include a gain factor that is less than unity.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A method comprising:

analyzing an input audio signal to determine a power spectral density profile of the input audio signal;

comparing the power spectral density profile of the input audio signal with a plurality of template profiles; and selectively attenuating frequency bands of the input audio signal based on the comparing.

2. The method of claim 1, wherein the plurality of template profiles includes three template profiles.

3. The method of claim 1, wherein the selectively attenuating includes selecting one of the plurality of template profiles based on the comparing.

4. The method of claim 3, wherein the selective attenuating further includes determining a respective attenuation factor for each of the frequency bands of the input audio signal based on a distance, for the respective frequency band, between the power spectral density profile and the selected template profile.

5. The method of claim 3, wherein the selecting of one of the plurality of template profiles is based on respective distances between the template profiles and the power spectral density profile of the input audio signal.

6. The method of claim 5, wherein the selecting of one of the plurality of template profiles is based on respective weighted distances between the template profiles and the power spectral density profile of the input audio signal.

7. The method of claim 1, further comprising:

using the input audio signal to drive a speaker after the selectively attenuating of the frequency bands of the input audio signal.

8. A method comprising:

analyzing an input audio signal to determine a power spectral density profile of the input audio signal;

adjusting the power spectral density profile to form an adjusted power spectral density profile;

comparing the adjusted power spectral density profile with at least one template profile; and selectively attenuating frequency bands of the input audio signal on the basis of the comparing.

9. The method of claim 8, wherein the adjusting is based on a signal received via a microphone.

10. The method of claim 9, wherein the adjusting is based on an estimated external gain between a speaker and the microphone.

11. The method of claim 8, wherein the comparing includes comparing the adjusted power spectral density profile with a plurality of template profiles.

12. The method of claim 11, wherein the plurality of template profiles includes three template profiles.

13. The method of claim 11, wherein the selectively attenuating includes selecting one of the plurality of template profiles based on the comparing.

14. The method of claim 13, wherein the selectively attenuating further includes determining a respective attenuation factor for each of the frequency bands of the input audio signals based on a distance, for the respective frequency band, between the adjusted power spectral density profile and the selected template profile.

15. The method of claim 13, wherein the selecting of one of the plurality of template profiles is based on respective distances between the template profiles and the adjusted power spectral density profile.

16. The method of claim 15, wherein the selecting of one of the plurality of template profiles is based on respective weighted distances between the template profiles and the adjusted power spectral density profile.

17. The method of claim 8, further comprising:

using the input audio signal to drive a speaker after the selectively attenuating of the frequency bands of the input audio signal.

18. An apparatus comprising:

a processor to couple to a speaker; and a memory coupled to the processor;

wherein the processor is to:

analyze an input audio signal to determine a power spectral density profile of the input audio signal;

compare the power spectral density profile of the input audio signal with a plurality of template profiles residing in the memory; and selectively attenuate frequency bands of the input audio signal on the basis of the comparison of the power spectral density profile with the at least one template profile.

19. The apparatus of claim 18, wherein the plurality of template profiles residing in the memory includes three template profiles.

20. The apparatus of claim 18, wherein the processor is to select one of the plurality of template profiles based on the comparison of the power spectral density profile of the input audio signal with the plurality of template profiles.

21. The apparatus of claim 20, wherein the processor is to determine a respective attenuation factor for each of the frequency bands of the input audio signal based on a distance, for the respective frequency band, between the power spectral density profile and the selected template profile.

22. The apparatus of claim 20, wherein the processor is to select one of the plurality of template profiles based on respective distances between the template profiles and the power spectral density profile of the input audio signal.

23. The apparatus of claim 22, wherein the processor is to select one of the plurality of template profiles based on respective weighted distances between the template profiles and the power spectral density profile of the input audio signal.

24. The apparatus of claim 18, wherein the processor is to apply the input audio signal to a speaker after the selective attenuating of the frequency bands of the input audio signal.

25. An apparatus comprising:

a processor to couple to a speaker;

a microphone coupled to the processor; and a memory coupled to the processor;

wherein the processor is programmed to:

receive an input audio signal;

analyze the input audio signal to determine a power spectral density profile of the input audio signal;

adjust the power spectral density profile to form an adjusted power spectral density profile;

compare the adjusted power spectral density profile of the input audio signal with at least one template profile residing in the memory; and selectively attenuate frequency bands of the input audio signal based on the comparison of the adjusted power spectral density profile with the at least one template profile.

26. The apparatus of claim 25, wherein the processor is to adjust the power spectral density profile based on a signal received via the microphone.

27. The apparatus of claim 26, wherein the processor is to adjust the power spectral density profile based on an estimated external gain between the speaker and the microphone.

28. The apparatus of claim 25, wherein the processor is to compare the adjusted power spectral density profile of the input audio signal with a plurality of template profiles residing in the memory.

29. The apparatus of claim 28, wherein the plurality of template profiles residing in the memory includes three template profiles.

30. The apparatus of claim 28, wherein the processor is to select one of the plurality of template profiles based on the comparison of the adjusted power spectral density profile of the input audio signal with the plurality of template profiles.

31. The apparatus of claim 30, wherein the processor is to determine a respective attenuation factor for each of the frequency bands of the input audio signal based on a distance, for the respective frequency band, between the adjusted power spectral density profile and the selected template profile.

32. The apparatus of claim 30, wherein the processor is to select one of the plurality of template profiles based on respective distances between the template profiles and the adjusted power spectral density profile of the input audio signal.

33. The apparatus of claim 32, wherein the processor is to select one of the plurality of template profiles based on respective weighted distances between the template profiles and the adjusted power spectral density profile of the input audio signal.

34. The apparatus of claim 25, wherein the processor is to apply the input audio signal to a speaker after the selective attenuating of the frequency bands of the input audio signal.

35. An apparatus comprising:

a storage medium having stored thereon instructions that when executed by a machine result in the following:

analyzing an input audio signal to determine a power spectral density profile of the input audio signal;

comparing the power spectral density profile of the input audio signal with a plurality of template profiles; and selectively attenuating frequency bands of the input audio signal based on the comparing.

36. The apparatus of claim 35, wherein the selectively attenuating includes selecting one of the plurality of template profiles based on the comparing.

37. An apparatus comprising:

a storage medium having stored thereon instructions that when executed by a machine result in the following:

analyzing an input audio signal to determine a power spectral density profile of the input audio signal;

adjusting the power spectral density profile to form an adjusted power spectral density profile;

comparing the adjusted power spectral density profile with at least one template profile; and selectively attenuating frequency bands of the input audio signal on the basis of the comparing.

38. The apparatus of claim 37, wherein the adjusting is based on a signal received via a microphone.

39. The apparatus of claim 38, wherein the adjusting is based on an estimated external gain between a speaker and the microphone.

40. A method comprising:

storing at least one template profile in a memory in a cellular telephone;

receiving an audio signal via an antenna of the cellular telephone;

analyzing the audio signal to determine a power spectral density profile of the audio signal;

comparing the power spectral density profile of the audio signal with the at least one template profile; and selectively attenuating frequency bands of the audio signal based on the comparing.

* * * * *